(12) United States Patent
Chiang

(10) Patent No.: US 6,762,361 B1
(45) Date of Patent: Jul. 13, 2004

(54) SLIDING LID WITH ANCHORING STRUCTURE FOR ELECTRONIC DEVICES

(75) Inventor: Thomas Chiang, Taipei (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/419,195

(22) Filed: Apr. 21, 2003

(30) Foreign Application Priority Data

Dec. 24, 2002 (TW) ...................................... 91221026 U

(51) Int. Cl.[7] .............................. H02G 3/08; H05K 5/00
(52) U.S. Cl. ...................... 174/52.1; 361/752; 361/809; 174/50
(58) Field of Search .................. 174/52.1, 50; 361/809, 361/752, 796, 807

(56) References Cited

U.S. PATENT DOCUMENTS

| | | | | |
|---|---|---|---|---|
| 3,746,207 A | * | 7/1973 | Lenhart | 220/326 |
| 3,784,727 A | * | 1/1974 | Haubein | 174/52.1 |
| 4,031,312 A | * | 6/1977 | Coleman et al. | 174/52.1 |
| 5,801,331 A | * | 9/1998 | Zachrai | 174/52.1 |

* cited by examiner

Primary Examiner—Hung V. Ngo
(74) Attorney, Agent, or Firm—Birch, Stewart, Kolasch & Birch, LLP

(57) ABSTRACT

A sliding lid with an anchoring structure for covering a signal transmission port of an electronic device includes a housing of the electronic device, a first lid and a second lid. The housing has a first opening and a second opening corresponding respectively to the upper side and a lateral side of the signal transmission port. The first lid and the second lid correspond to the first opening and the second opening. The second lid is pivotally engaged with the first lid. The second lid may be slid in the second opening and spare a slot opening to allow a flat cable to pass through. The first lid is pivotally turned to cover the first opening. The invention improves the convenience of assembly and detachment of the lids, and also can prevent dusts or external objects from entering into the exposed signal transmission port of the electronic device.

6 Claims, 4 Drawing Sheets

SLIDING LID WITH ANCHORING STRUCTURE FOR ELECTRONIC DEVICES

FIELD OF THE INVENTION

The invention relates to a sliding lid with an anchoring structure for covering a signal transmission port of electronic devices, particularly to a sliding lid with an anchoring structure that improves the convenience of assembly and detachment and prevents dust or external objects from entering into the exposed signal transmission port.

BACKGROUND OF THE INVENTION

Many electronic devices have a signal transmission port to connect other electronic devices through a flat cable for data-transmitting. Hence it is necessary to provide an opening on two normal side walls of the housing of the electronic device to mate the signal transmission port, receiving the flat cable for connecting other electronic devices. However, before the electronic devices are connected, the signal transmission ports are exposed and often contaminated by dust or external objects. That could result in poor connection or even dysfunction of the signal transmission port.

Lately, there has been design providing an L-shaped lid to cover the opening, formed on the two normal side walls of the housing of the electronic devices. To solve the problem mentioned above, the lid covers the opening when the electronic device is not connected externally. When the electronic device is connected, the L-shaped lid is removed from the opening for connecting the flat cable to the signal transmission port. However, such a design also has problems. For instance, when two electronic devices are too close to each other, or there is a need to inspect the flat cable, it is difficult to remove the L-shaped lid. Installation of the lid on the opening of the housing of the electronic device is also not easy.

SUMMARY OF THE INVENTION

In view of the aforesaid disadvantages, the primary object of the invention is to provide a sliding lid with an anchoring structure for electronic devices. The invention improves the convenience of detachment and assembly of a lid and prevents dust or external objects from entering into the exposed signal transmission port of electronic devices.

The sliding lid, with an anchoring structure for electronic devices of the invention, aims to cover the signal transmission port of electronic devices. It includes a housing of an electronic device, a first lid and a second lid. The housing has a first opening and a second opening corresponding respectively to an upper side and a lateral side of the signal transmission port. The first lid corresponds to the first opening. The second lid is pivotally engaged with the first lid and corresponds to the second opening. The second lid is slid in the second opening with lateral sides thereof coupling with lateral sides of the second opening but has space on one side of the second opening to form a slot opening. The first lid is pivotally engaged with the second lid and has one side reaching a lateral side of the first opening to cover the first and the second opening. Only the slot opening remains uncovered. Thus the invention improves the convenience of detachment and assembly of the lid, and prevents dust or external objects from entering into the exposed signal transmission port.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
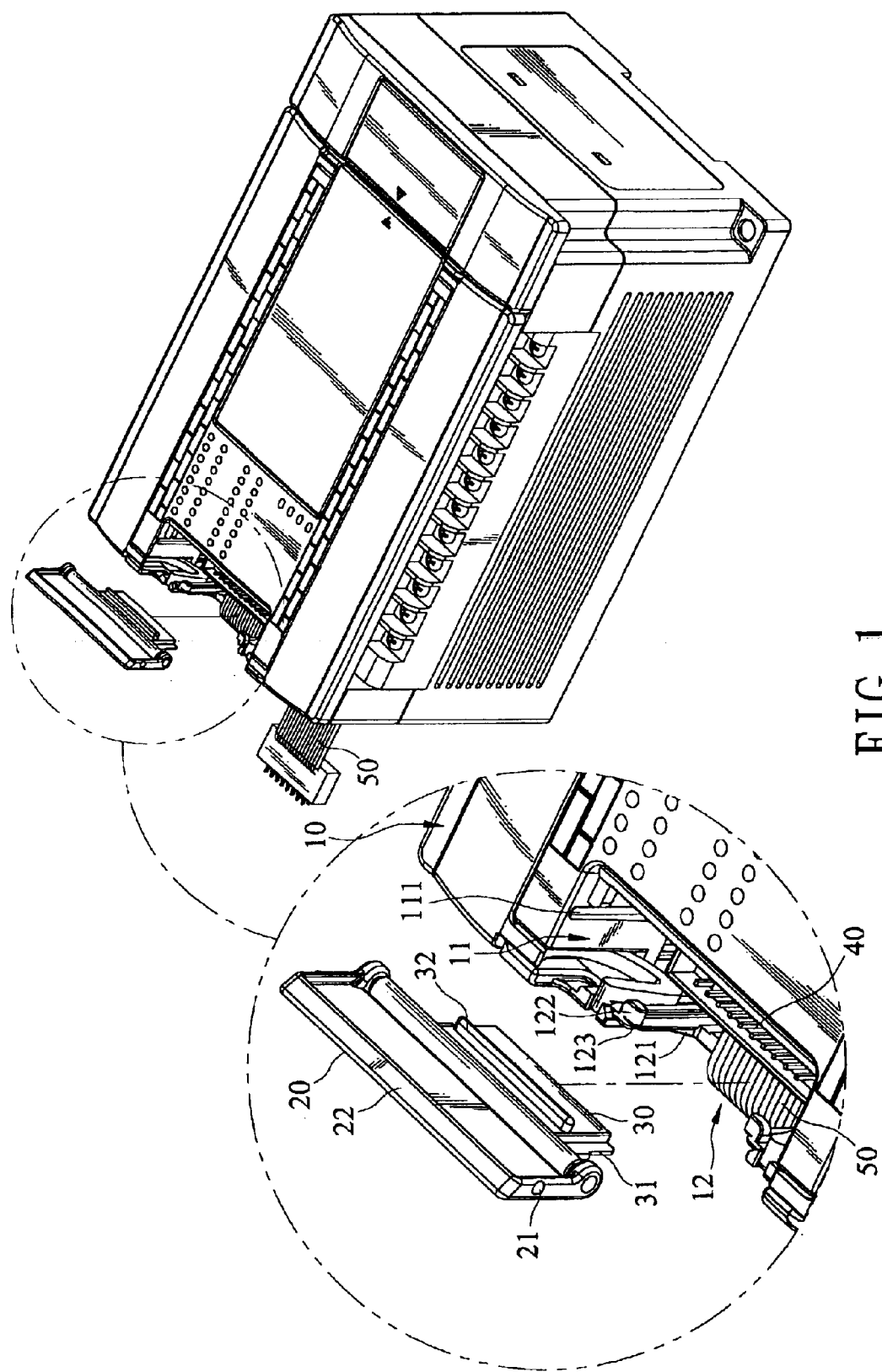
FIG. 1 is an exploded view of the invention.
Figure 2A:
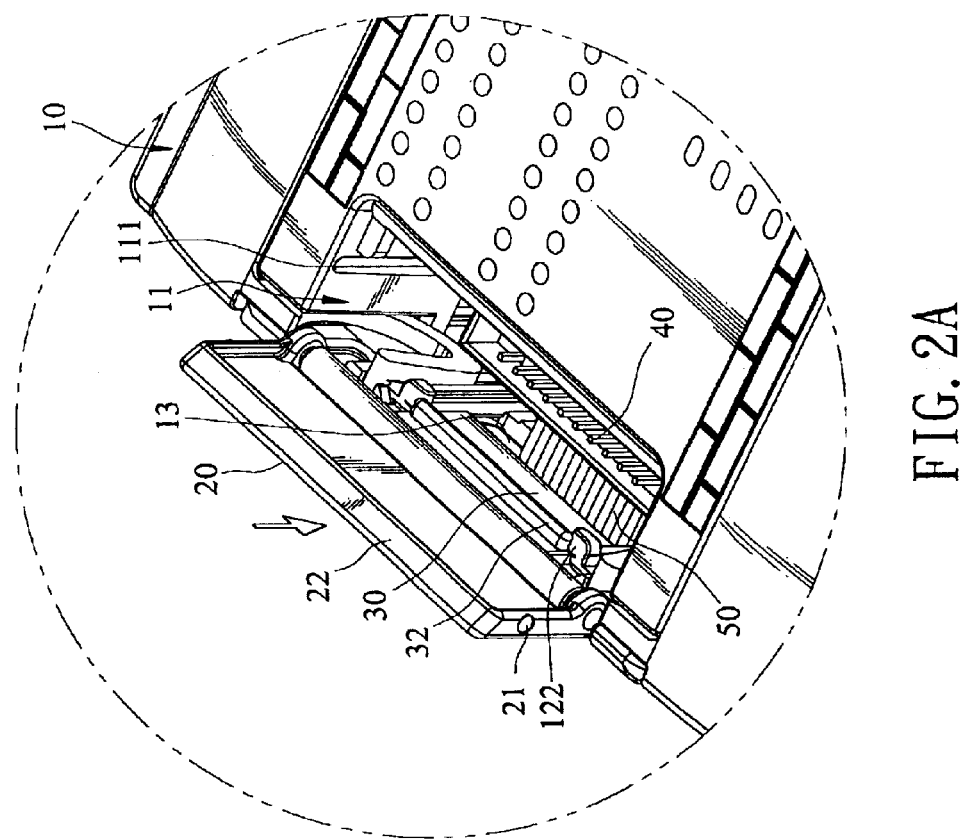
FIGS. 2A, 2B and 2C are schematic views of the invention showing the operating conditions of the first lid and the second lid covering the first opening and the second opening.
Figure 2B:
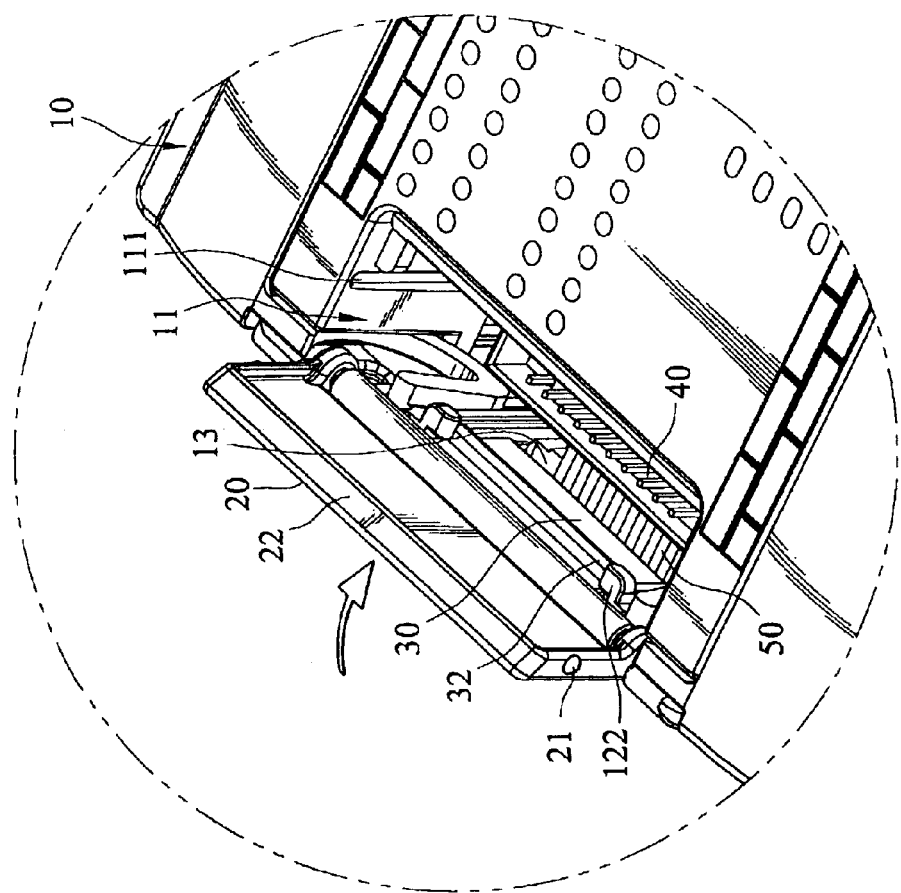
Figure 2C:
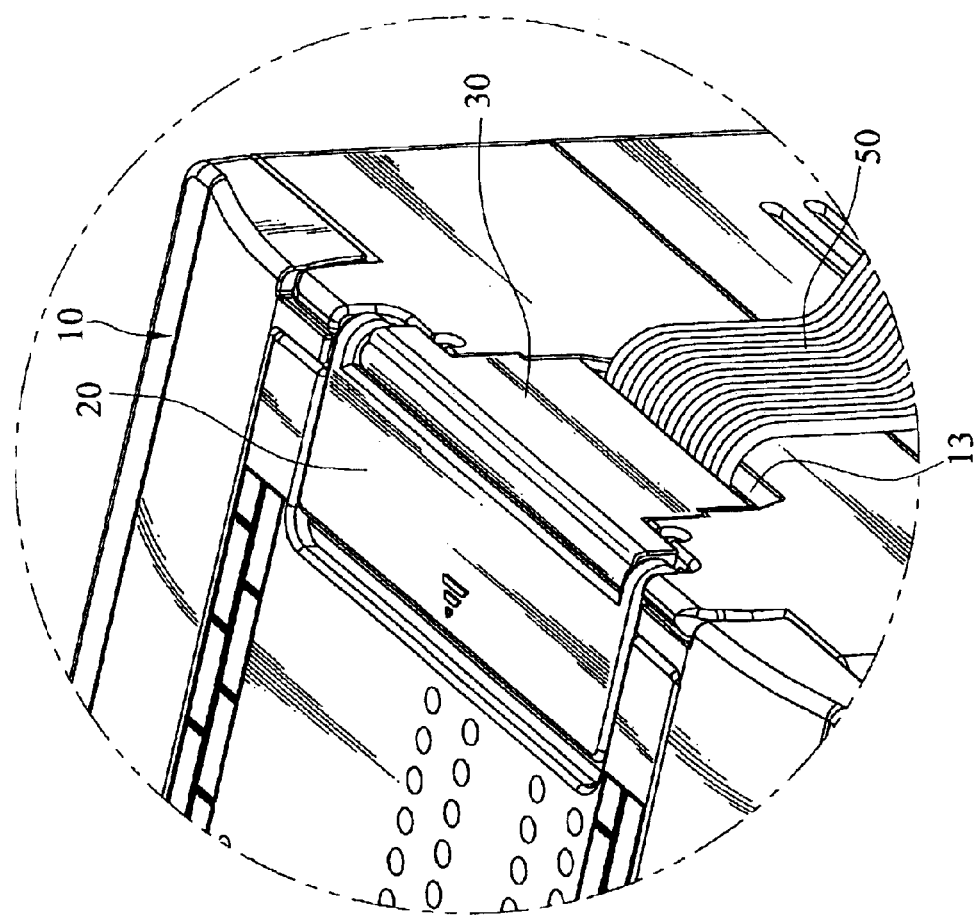

Referring to FIGS. 1 through 2C, the sliding lid with an anchoring structure of the covers a signal transmission port for electronic devices. The invention includes a housing 10 of an electronic device, a first lid 20 and a second lid 30. The housing 10 has a first opening 11 and a second opening 12, corresponding respectively to an upper side and a lateral side of a signal transmission port 40 of the electronic device. The first opening 11 has latch troughs 111, located on two lateral sides. The second opening 12 has two lateral sides each has a dovetail trough 121 and a bucking member 122 which is extended to form a bucking surface 123.

The first lid 20 corresponds to the first opening 11, and includes a bulged spot 21 and a sloped surface 22. The bulged spot 21 is located on one lateral side of the first lid 20 corresponding to the latch trough 111 of the first opening, so when the side edge of the first lid 20 is coupled with the lateral side of the first opening 11, the sloped surface 22 is located on one end of the first lid 20. Moreover, the top surface of the first lid 20 has a greater length than the bottom surface to facilitate moving of the first lid with force to separate the bulged spot 21 from the latch trough 111.

The second lid 30 has one end pivotally engaged with one end of the first lid 20 opposite to the sloped surface 22. The second lid 30 corresponds to the second opening 12. It includes a dovetail surface 31 and a ram ridge 32. The dovetail surface 31 is located on the lateral side of the second lid 30 to couple with the dove tail trough 121 located on the lateral side of the second opening 12 so that the lateral side of the second lid 30 is coupled with the lateral side of the second opening 12. The ram ridge 32 is located on an inner wall of the second lid 30 corresponding to the bucking members 122, located on two lateral sides of the second opening 12. When the second lid 30 slides in the second opening 12, the ram ridge 32 presses the fastening parts 122 which is expanded outwards to allow the ram ridge 32 to pass through so that the second lid 30 may be anchored on the second opening 12.

Referring to FIGS. 2A, 2B and 2C, when covering the first opening 11 and the second opening 12 with the first lid 20 and the second lid 30, first, move the second lid 30 in contact with the bucking surface 123 on the lateral side of the second opening 12, and slide the second lid 30 in the second opening 12. During the sliding process, the dovetail surface 31 also slides in the dovetail trough 121 on the lateral side of the second opening 12, and the ram ridge 32 on the inner wall presses the bucking member 122 to expand outwards so that the ram ridge 32 passes through the bucking member 122 to allow the second lid 30 be anchored on the second opening 12 to cover the second opening 12. A slot opening 13 is spared to allow a flat cable 50 to pass through. Next, pivotally turn the first lid 20 relative to the second lid 30 to enable the first lid 20 to cover the first opening 11. In the mean time, the bulged spot 21 on the lateral side of the first lid 20 is latched in the latch trough 111 on the lateral side of the first opening 11 so that the first lid 20 is anchored in the first opening 11 to cover the first opening 11. Thus the invention is easily assembled.

For removing, apply a force on the sloped surface of the first lid 20 to move the bulged spot 21 on the lateral side of the first lid 20 away from the latch trough 111 on the lateral side of the first opening 11; then pivotally turn the first lid 20 relative to the second lid 30 and apply a force on the second lid 30 such that the ram ridge 32 presses the bucking member 122 outwards and passes through, and the dovetail surface 31 on the lateral side of the second lid 30 is slid out of the dovetail trough 121 on the lateral side of the second opening 12. Thus the lids are easily detached.

Moreover, as the first opening 11 and the second opening 12 are covered by the first lid 20 and the second lid 30, the invention prevents dust or external objects from entering into the exposed signal transmission port 40 of the electronic device.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A sliding lid with an anchoring structure for covering a signal transmission port of electronic devices, comprising:
    a housing of an electronic device having a first opening and a second opening corresponding respectively to an upper side and a lateral side of the signal transmission port;
    a first lid corresponding to the first opening; and
    a second lid pivotally engaging with the first lid and corresponding to the second opening for sliding in the second opening with lateral sides of the second lid coupling with lateral sides of the second opening but sparing a slot opening;
    wherein after the first lid is pivotally turned relative to the second lid lateral sides of the first lid being coupled with lateral sides of the first opening to cover the first opening and the second opening except the slot opening.

2. The sliding lid with an anchoring structure of claim 1, wherein the first lid includes a bulged spot located on a lateral side thereof, the first opening having a latch trough located on a lateral side thereof corresponding to the bulged spot for the lateral side of the first lid to couple with the lateral side of the first opening.

3. The sliding lid with an anchoring structure of claim 1, wherein the first lid has a sloped surface on one end opposite to where the second lid is pivotally engaged, the first lid has a top surface of a greater length than the bottom surface thereof.

4. The sliding lid with an anchoring structure of claim 1, wherein each of the lateral sides of the second lid forms a dovetail surface, and each of the lateral sides of the second opening forms a dovetail trough corresponding to the dovetail surface for the lateral sides of the second lid to couple with the lateral sides of the second opening.

5. The sliding lid with an anchoring structure of claim 1, wherein the second lid has a ram ridge located on an inner wall, the second opening having two bucking members located on the lateral sides corresponding to the ram ridge such that the bucking members are pushed by the ram ridge and expanded outwards and to be passed through by the ram ridge for anchoring the second lid on the second opening.

6. The sliding lid with an anchoring structure of claim 1, wherein the two lateral sides of the second opening have respectively a bucking surface to allow the second lid to press and slide in the second opening.

* * * * *